(12) United States Patent
Vinke et al.

(10) Patent No.: US 11,434,878 B2
(45) Date of Patent: Sep. 6, 2022

(54) WIND TURBINE ROTOR BLADE WITH A LIGHTNING PROTECTION SYSTEM

(71) Applicant: Wobben Properties GmbH, Aurich (DE)

(72) Inventors: Daniel Vinke, Aurich (DE); Sebastian Engelhardt, Aurich (DE)

(73) Assignee: Wobben Properties GmbH, Aurich (DE)

( * ) Notice: Subject to any disclaimer, the term of this patent is extended or adjusted under 35 U.S.C. 154(b) by 0 days.

(21) Appl. No.: 16/956,481

(22) PCT Filed: Jan. 8, 2019

(86) PCT No.: PCT/EP2019/050276
§ 371 (c)(1),
(2) Date: Jun. 19, 2020

(87) PCT Pub. No.: WO2019/137881
PCT Pub. Date: Jul. 18, 2019

(65) Prior Publication Data
US 2020/0347826 A1    Nov. 5, 2020

(30) Foreign Application Priority Data
Jan. 9, 2018  (DE) ..................... 10 2018 100 302.1

(51) Int. Cl.
*F03D 80/30* (2016.01)
*F03D 1/06* (2006.01)
(Continued)

(52) U.S. Cl.
CPC ........... *F03D 80/30* (2016.05); *F03D 1/0675* (2013.01); *H01B 7/00* (2013.01); *H01Q 17/00* (2013.01);
(Continued)

(58) Field of Classification Search
CPC ... F03D 80/30; F05B 2260/99; H05K 9/0047; H05K 9/0098; H05K 9/0084
(Continued)

(56) References Cited

U.S. PATENT DOCUMENTS 4,301,428 A * 11/1981 Mayer .................. H01B 7/0054
174/36
4,814,546 A *  3/1989 Whitney .............. H05K 9/0083
174/36
(Continued)

FOREIGN PATENT DOCUMENTS

EP      3173619 A1    5/2017
EP      3255274 A1   12/2017
(Continued)

OTHER PUBLICATIONS

NPL Thermoplastic Polyurethane, "Thermoplastic Polyurethane", Wikipedia, Jul. 15, 2017 (Year: 2017).*

*Primary Examiner* — Woody A Lee, Jr.
*Assistant Examiner* — Wesley Le Fisher
(74) *Attorney, Agent, or Firm* — Seed Intellectual Property Law Group LLP

(57) ABSTRACT

There is provided a wind turbine rotor blade comprising a rotor blade casing, and a lightning protection system having at least one lightning protection cable and a lighting protection cable holder. The lighting protection cable holder is fixed in or to the inside of the rotor blade casing. The lighting protection conductor holder has a first part and a second part. The first part is fixed to an inside of the rotor blade casing and has a receiving portion for receiving the lighting protection cable. The second part is in the form of a cover or covering means and is placed over the receiving portion. The first and second parts each have a radar-absorbing core or a radar-absorbing layer and an electrically insulating material which surrounds the radar-absorbing core or the radar-absorbing layer.

11 Claims, 4 Drawing Sheets

(51) Int. Cl.
*H01Q 17/00* (2006.01)
*H05K 9/00* (2006.01)
*H01B 7/00* (2006.01)

(52) U.S. Cl.
CPC ......... *H05K 9/0084* (2013.01); *H05K 9/0098* (2013.01)

(58) Field of Classification Search
USPC ........................................................ 342/1–4
See application file for complete search history.

(56) References Cited

U.S. PATENT DOCUMENTS

| | | | | |
|---|---|---|---|---|
| 5,106,437 | A * | 4/1992 | Lau | H05K 9/0098 156/84 |
| 7,948,424 | B2 * | 5/2011 | Kudo | D04H 1/587 342/1 |
| 8,598,470 | B2 * | 12/2013 | Kagawa | B32B 27/365 174/386 |
| 9,422,914 | B2 * | 8/2016 | Appleton | F03D 1/0675 |
| 9,640,297 | B2 * | 5/2017 | Restuccia | H01Q 17/00 |
| 9,920,739 | B2 * | 3/2018 | Akhtar | F03D 13/10 |
| 10,103,527 | B2 * | 10/2018 | Omura | H01B 7/18 |
| 10,330,075 | B2 * | 6/2019 | March Nomen | F03D 80/30 |
| 2007/0183888 | A1 | 8/2007 | Gunneskov et al. | |
| 2011/0223031 | A1 | 9/2011 | Bond | |
| 2011/0243737 | A1 * | 10/2011 | Bell | F03D 80/85 416/146 R |
| 2012/0057978 | A1 * | 3/2012 | Nieuwenhuizen | H02G 13/00 416/146 R |
| 2013/0135135 | A1 * | 5/2013 | Appleton | H01Q 17/00 342/1 |
| 2013/0280087 | A1 | 10/2013 | Appleton et al. | |
| 2020/0161731 | A1 * | 5/2020 | Himi | H01P 3/06 |

FOREIGN PATENT DOCUMENTS

| | | | | |
|---|---|---|---|---|
| GB | 2488561 | A | | 9/2012 |
| GB | 2503260 | A * | 12/2013 | ........... F03D 1/0675 |
| GB | 2503260 | A | | 12/2013 |

\* cited by examiner

WIND TURBINE ROTOR BLADE WITH A LIGHTNING PROTECTION SYSTEM

BACKGROUND

Technical Field

The present invention concerns a wind turbine rotor blade and a method of producing a wind turbine rotor blade as well as a lightning protection cable holder for a wind turbine rotor blade.

Description of the Related Art

Particularly in the case of wind turbines erected in the proximity of airfields, radar reflections, which are not constant, can occur by virtue of the moving rotor blades. Those non-constant rotor reflections can interfere with the radar systems of the airports or airfields.

Therefore the radar reflections generated by a wind turbine have to be reduced to be able to ensure that wind farms comprising a large number of wind turbines can be authorized in the proximity of airports or airfields or radar stations.

On the German patent application from which priority is claimed the German Patent and Trade Mark Office searched the following documents: EP 3 173 619 A1 and GB 2 488 561 A.

BRIEF SUMMARY

Provided is a wind turbine having reduced radar reflection. In particular, provided are wind turbine rotor blades which permit a reduction in radar reflections.

Thus a wind turbine rotor blade has a rotor blade casing and a lightning protection system. The lightning protection system has at least one lightning protection cable and a holder for the lightning protection cable. The holder can be fixed internally to the rotor blade casing. In particular the holder can be glued internally to the rotor blade casing. The holder has a first portion for fixing to the rotor blade casing and for receiving the lightning protection cable and a second portion which is fixed on the portion for completely enclosing the first portion and the lightning protection cable disposed therein. The first and/or second holding portion has a radar-absorbing portion and an electrically insulating material.

The electrically insulating material disposed in particular between the rotor blade casing and the lightning protection cable makes it possible to ensure that, in the event of a lightning strike, no damage is done to the material of the rotor blade casing. The radar-absorbing material can ensure that the radar reflections of the wind turbine rotor blade are considerably reduced.

According to an aspect of the present invention the radar-absorbing portion is in the form of a core of the first and/or second portion and is made from a radar-absorbing material. The electrically insulating material then surrounds the radar-absorbing core as a casing.

According to an aspect of the present invention the holder has a first part fixed on the rotor blade casing. The first part has a recess for receiving the lightning protection cable. The holder has a second part which is in the form of a cover or covering means and is fixed over or on the first part.

According to a further aspect of the present invention the first part of the holder has a straight adhesive portion, in particular consisting of the electrically insulating material.

The first part of the holder also has a substantially U-shaped holding portion for receiving the lightning protection cable. A cover (as the second part) is placed over the first part and then together with the first portion completely covers over the lightning protection cable. The first and second parts each comprise an electrically insulating material with a radar-absorbing material as the core or as an inner layer.

According to a further aspect of the present invention the radar-absorbing material is in the form of a Salisbury screen or a Dallenbach layer.

The electrically insulating material can be made from TPU.

Also provided is a method of producing a wind turbine rotor blade. A rotor blade casing is provided for that purpose. Then a holder for a lightning protection cable is fixed on the inside of the rotor blade casing, in particular by adhesive. In that case in particular a first part of the holder comprising an electrically insulating material is fixed to the inside of the rotor blade casing. A radar-absorbing material is further provided in the first part. Then the lightning protection cable is placed in the first part and a second part, for example in the form of a cover or a covering means, is placed over the first part so that the lightning protection cable is completely surrounded by the first and second parts. The second part also comprises an electrically insulating material with a radar-absorbing material. In that way the lightning protection cable is completely surrounded by an electrically insulating material and a radar-absorbing material. In that arrangement the first and second parts can overlap each other so that both the electrically insulating material and also the radar-absorbing material of the first and second parts cover each other over.

Also provided is a lightning protection cable holder for a wind turbine, with a first part which can be fixed to a rotor blade internal surface with its first side and which has a recess for receiving a lightning protection cable, and a cover or a covering means which is placed as a second part on the first part so that the first and second parts overlap. The first and/or the second part each have an electrically insulating material and a radar-absorbing material.

According to an aspect of the present invention there is provided a wind turbine rotor blade having a rotor blade casing and a lightning protection system with at least one lightning protection cable. The lightning protection cable has a metallic electrical conductor, an insulating portion and radar-absorbing material. The insulating portion surrounds the metallic conductor. The radar-absorbing material can be provided in particle form in the insulating material. As an alternative thereto the radar-absorbing material can be provided as a jacket around the electrical conductor. As an alternative thereto the radar-absorbing material can be provided between the electrical conductor and the insulation portion.

Further configurations of the invention are recited in the appendant claims.

BRIEF DESCRIPTION OF THE SEVERAL VIEWS OF THE DRAWINGS

Embodiments by way of example and advantages of the invention are described in greater detail hereinafter with reference to the drawing.

DETAILED DESCRIPTION

Figure 1:
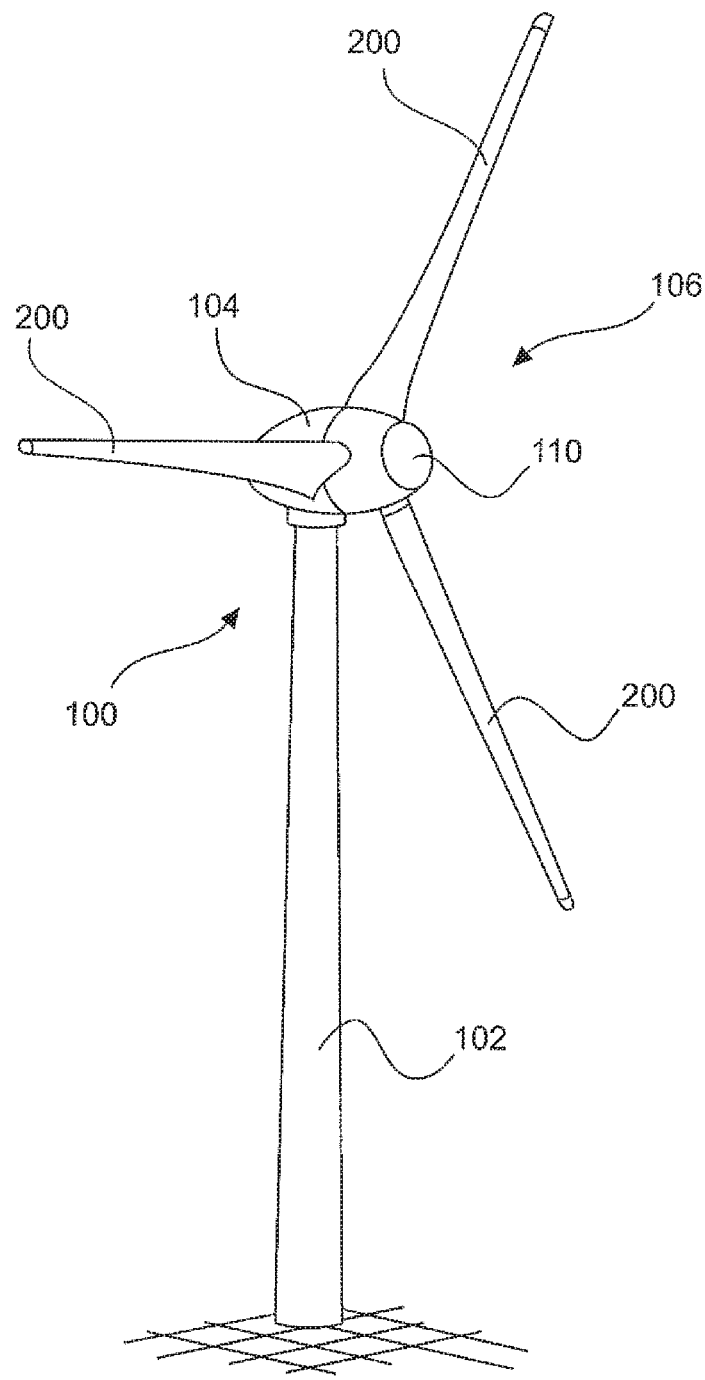
FIG. 1 shows a diagrammatic view of a wind turbine according to the invention.

FIG. 1 shows a wind turbine 100 comprising a tower 102 and a nacelle 104. Arranged on the nacelle 104 is a rotor 106 having three rotor blades 200 and a spinner 110. The rotor 106 is caused to rotate by the wind in operation and thereby drives a generator in the nacelle 104. The rotor blade 200 is made from two half-shell portions 230 which are then secured together by adhesive. The rotor blade has a rotor blade tip 210 and a rotor blade root 220.

Figure 2:
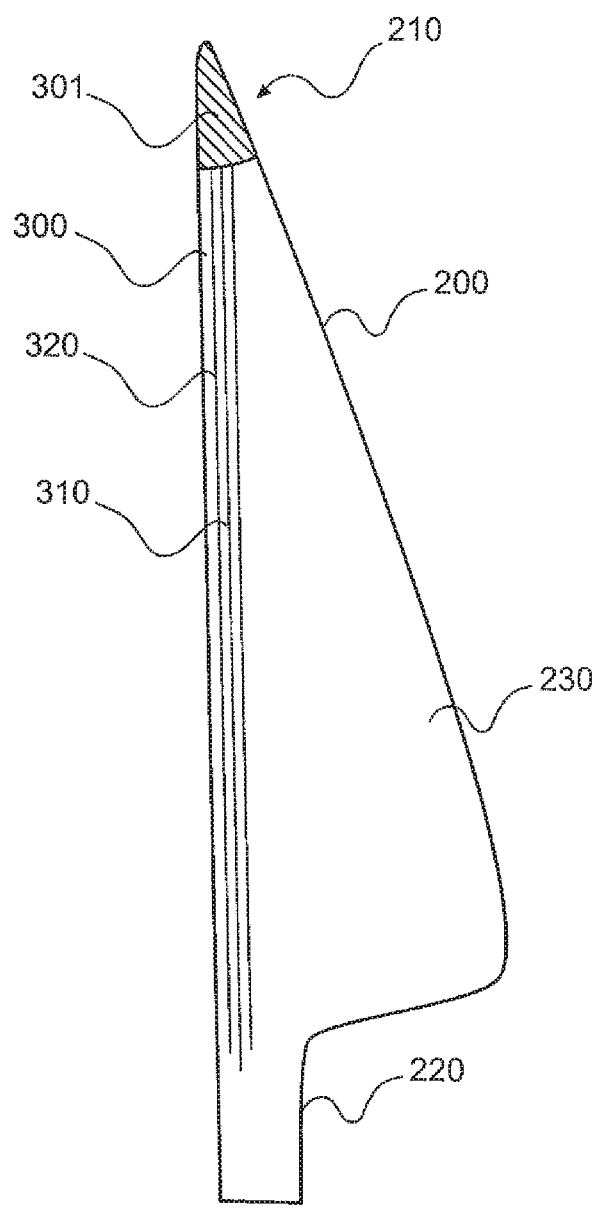
FIG. 2 shows a diagrammatic view of a wind turbine rotor blade.

FIG. 2 shows a diagrammatic view of a wind turbine rotor blade. The rotor blade 200 has a rotor blade tip 210 and a rotor blade root 220. The rotor blade further has a rotor blade casing 230 which for example comprises two half-shell portions which are secured together by adhesive.

In addition the rotor blade 200 has a lightning protection system 300. A lightning receptor 301 can be provided in the region of the rotor blade tip 210. The lightning protection system 300 further has a lightning protection cable 310 and a holder 320 for the lightning protection cable 310. The lightning protection cable 310 can for example extend from the lightning receptor 301 into the region of the rotor blade root 220. From there the lightning protection cable can be passed downwardly through a hub, the nacelle and the tower of the wind turbine and connected to ground.

The lightning protection cable 320 is fixed to the rotor blade casing 230 and the lightning protection cable 320 is placed in the holder 310.

Figure 3:
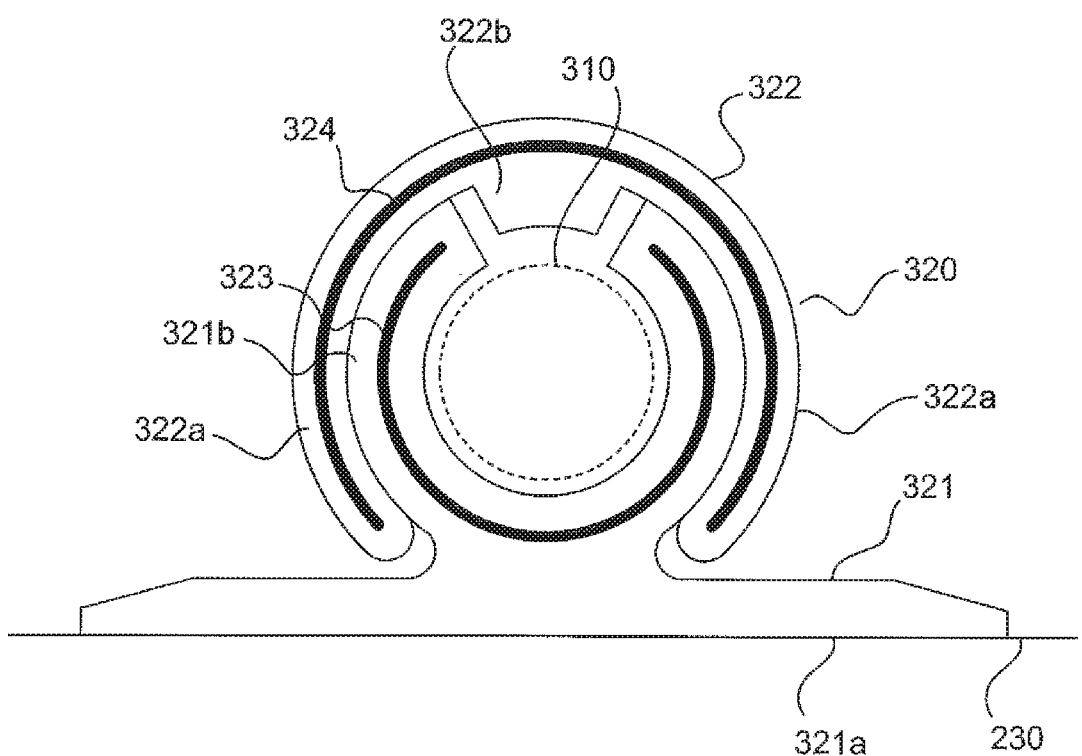
FIG. 3 shows a diagrammatic sectional view of a lightning protection cable holder according to an aspect of the present invention, and FIGS. 4A to 4F each show a diagrammatic cross-section through a lightning protection cable according to a further aspect of the invention.

FIG. 3 shows a diagrammatic cross-section of the lightning protection cable holder 320. The holder 320 has a first part 321 which can be fixed to the rotor blade casing 320 of the rotor blade. For that purpose in particular a first straight end 321a can be glued on or to the material of the rotor blade casing 230. The first part 321 further has a receiving portion 321b which for example is of a substantially U-shaped configuration and has an opening through which the lightning protection cable 320 can be placed in the first part 321 of the holder 320.

The holder 320 further has a covering means or a cover 322 which can be placed over the receiving portion 321b of the first part. The receiving portion 321b has a core or a layer of radar-absorbing material 323 and an electrically insulating material 321b surrounding the radar-absorbing material 323.

The second part 322 of the holder can be of a substantially U-shaped or C-shaped configuration and can be placed over the first part 321 of the holder 320 to close an opening in the first part 321. The second part 322 of the holder 320 has a radar-absorbing core 323 or a radar-absorbing layer 324 as well as an electrically insulating material surrounding the layer.

When the lightning protection cable 310 is placed in the receiving portion 321b and the covering means 322 is placed on the receiving portion 321b then the lightning protection cable 310 is completely enclosed by an electrically insulating material and a radar-absorbing material. In that case the receiving portion 321b and the second part 322 can overlap.

The receiving portion 321b can in particular have two arms which each have a radar-absorbing material and an electrically insulating material surrounding same. The second part 322 can also have two arms which can surround the arms of the first part in order thereby to completely enclose the lightning protection cable and thus permit optimum radar absorption.

By virtue of the fact that the radar-absorbing core or the radar-absorbing layer is completely surrounded by an electrically insulating material on the one hand this ensures effective lightning protection while on the other hand the radar absorption effects can be effectively reduced. That affords an effective way of reducing the complication and expenditure in terms of installing a lightning protection system with radar-absorbing properties in rotor blade manufacture.

The electrically insulating material can be made from a thermoplastic polyurethane TPU.

Figure 4A:
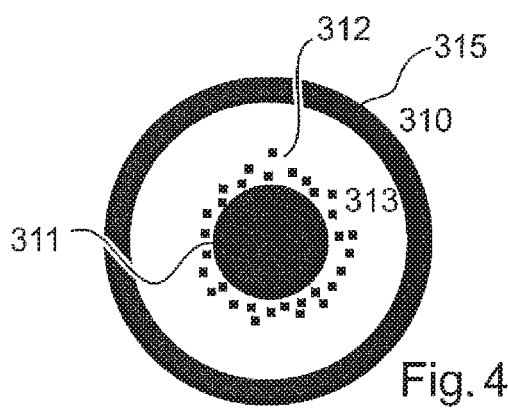
Figure 4B:
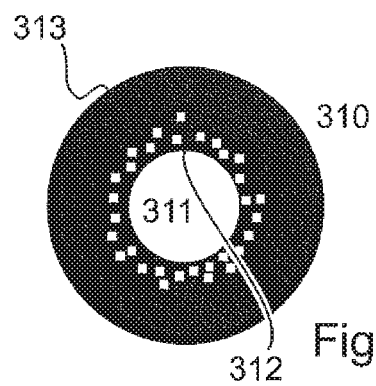

FIGS. 4A to 4F each show a diagrammatic cross-section through a lightning protection cable according to a further aspect of the invention. The lightning protection cable according to the further aspect of the present invention can be used in the wind turbine of FIG. 1 and in the rotor blade of FIG. 2. In FIGS. 4A and 4B the arrangement respectively has a lightning protection cable having a metallic conductor 311, an insulator 313 and radar-absorbing material 312, for example in the form of particles which are distributed within the electrical insulation 313. While an outer jacket 315 is provided in the cable in FIG. 4A that jacket is not present in the lightning protection cable shown in FIG. 4B.

Figure 4C:
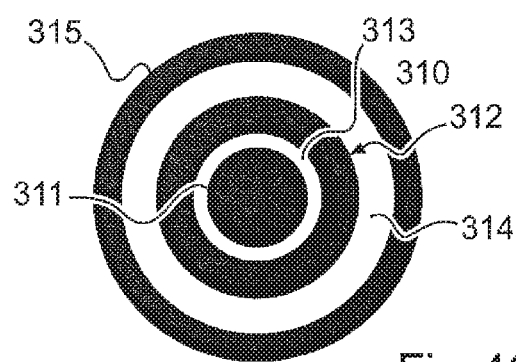
Figure 4D:
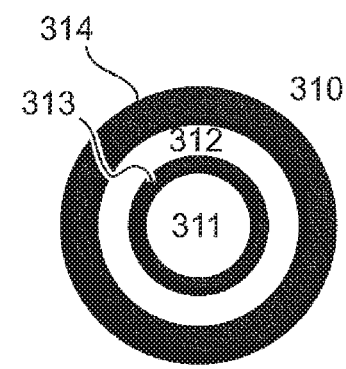

FIGS. 4C and 4D show a further lightning protection cable having an electrical conductor 311, an insulating portion 313 surrounding the conductor, a radar-absorbing material 312, a further insulating portion 314 and, in FIG. 4C, an outer jacket 315. The jacket 315 is not provided in the lightning protection cable shown in FIG. 4D.

Accordingly the radar-absorbing material 312 is illustrated as solid material surrounding the insulating portion 313 in the lightning protection cables shown in FIGS. 4C and 4D.

Figure 4E:
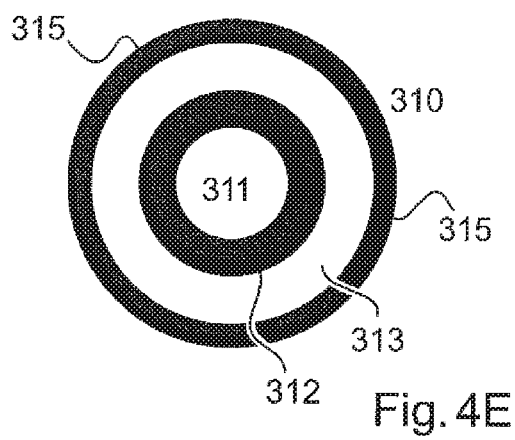
Figure 4F:
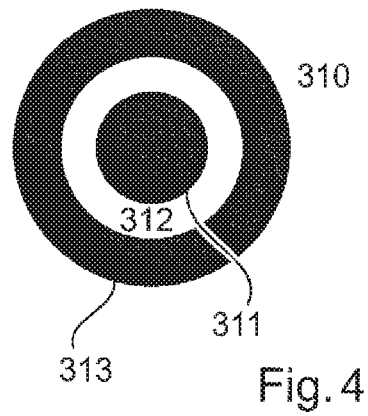

FIGS. 4E and 4F also show a cross-section through a lightning protection cable. The lightning protection cable has a metallic conductor 311 as a core, a radar-absorbing solid material 312 which surrounds the core and an insulating portion 313 surrounding the radar-absorbing material 312. Optionally—as shown in FIG. 4E—an outer jacket 315 can be provided. That jacket 315 is not provided in the lightning protection cable shown in FIG. 4F.

In a further embodiment of the invention therefore there is provided a fully insulated lightning protection system having a lightning protection conductor or cable which permits low radar reflection.

According to a further aspect of the invention there is provided a lightning protection cable or a lightning protection cable harness which in the interior has a metallic conductor and an electrical insulation around the conductor. The radar-absorbing material serves to reduce radar reflection. The radar-absorbing material 312 can be provided between the electrical conductor and the electrical insulation. As an alternative thereto the radar-absorbing material can also be provided around the electrical insulation.

The radar-absorbing material can represent a Salisbury screen, a magnetic absorber or a Dallenbach layer. Adequate electrical insulation can be provided between the radar-absorbing absorber and the surrounding environment. That is achieved by the electrical insulation of the electrical conductor.

The lightning protection cable shown in FIGS. 4A to 4F can be provided in a lightning protection conductor holder 320 as shown in FIG. 3, in which case it is possible to dispense with the radar-absorbing layer 323.

The invention claimed is:

1. A wind turbine rotor blade, comprising:
 a rotor blade casing; and
 a lightning protection system having at least one lightning protection cable and a lighting protection cable holder,
 wherein the lighting protection cable holder has a first part and a second part, wherein the first part is coupled to an inside portion of the rotor blade casing and has a receiving portion for receiving a longitudinal length of the at least one lighting protection cable,
 wherein the second part forms a cover that is placed over the receiving portion and covers the longitudinal length of the at least one lighting protection cable, and
 wherein the first and second parts each have a radar-absorbing core or a radar-absorbing layer and an electrically insulating material surrounding the radar-absorbing core or the radar-absorbing layer.

2. The wind turbine rotor blade according to claim 1 wherein:
 the first part of the lighting protection cable holder has a straight adhesive portion, and a receiving portion, the receiving portion having radar-absorbing material and electrically insulating material surrounding the radar-absorbing material.

3. The wind turbine rotor blade according to claim 2, wherein the straight adhesive portion is made of an electrically insulating material.

4. The wind turbine rotor blade according to claim 2, wherein the receiving portion is of a U-shaped or C-shaped configuration and is configured to receive the lighting protection cable.

5. The wind turbine rotor blade according to claim 2, wherein the second part is of a C-shaped or U-shaped configuration and is placed over the receiving portion.

6. The wind turbine rotor blade according to claim 2 wherein the radar-absorbing material represents a Salisbury screen or a Dallenbach layer.

7. The wind turbine rotor blade according to claim 1 wherein the electrically insulating material is a thermoplastic polyurethane (TPU).

8. A wind turbine, comprising:
 a hub; and
 the wind turbine rotor blade according to claim 1 coupled to the hub.

9. The wind turbine rotor blade according to claim 1, wherein the receiving portion is configured to receive an entire longitudinal length of the at least one lighting protection cable.

10. The wind turbine rotor blade according to claim 9, wherein the second part covers the entire longitudinal length of the at least one lighting protection cable.

11. The wind turbine rotor blade according to claim 1, wherein the second part overlaps portions of the first part.

* * * * *